United States Patent
Atsatt et al.

(10) Patent No.: US 10,187,064 B1
(45) Date of Patent: Jan. 22, 2019

(54) SYSTEMS AND METHODS FOR ROUTING DATA ACROSS REGIONS OF AN INTEGRATED CIRCUIT

(71) Applicant: Intel Corporation, Santa Clara, CA (US)

(72) Inventors: Sean R. Atsatt, Santa Cruz, CA (US); Herman Henry Schmit, Palo Alto, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/828,238

(22) Filed: Nov. 30, 2017

(51) Int. Cl.
*H03K 19/177* (2006.01)

(52) U.S. Cl.
CPC ... *H03K 19/17796* (2013.01); *H03K 19/1774* (2013.01); *H03K 19/17724* (2013.01); *H03K 19/17792* (2013.01)

(58) Field of Classification Search
None
See application file for complete search history.

(56) References Cited

U.S. PATENT DOCUMENTS

2012/0221833 A1* 8/2012 Allaire ............... G06F 15/7867
712/37

* cited by examiner

*Primary Examiner* — Jany Richardson
(74) *Attorney, Agent, or Firm* — Fletcher Yoder, P.C.

(57) ABSTRACT

An integrated circuit may include multiple programmable logic regions and a first plurality of routers. Each of the first plurality of routers is coupled to a respective region of a first portion of the programmable logic regions, and each of the first portion of the plurality of regions transmits configuration data to a first set of adjacent regions of the first portion of regions. The integrated circuit may also include a second plurality of routers, and each of the second plurality of routers is coupled to a respective region of a second portion of the regions. Each of the second portion of the regions transmits the configuration data to a second set of adjacent regions of the first portion of regions. The integrated circuit may also include a voltage regulator that distributes a voltage to each of the regions.

20 Claims, 8 Drawing Sheets

| FIVR 3A, 3B, 3C, 3D | UIB | | | | FIVR 2A, 2B, 2C, 2D |
|---|---|---|---|---|---|
| 3A | 3B | 3B | 2B | 2B | 2A |
| 3A | 3B | 3B | 2B | 2B | 2A |
| 3C | 3D | 3D | 2D | 2D | 2C |
| 3C | 3D | 3D | 2D | 2D | 2C |
| 1C | 1D | 1D | 0D | 0D | 0C |
| 1C | 1D | 1D | 0D | 0D | 0C |
| 1A | 1B | 1B | 0B | 0B | 0A |
| 1A | 1B | 1B | 0B | 0B | 0A |
| FIVR 1A, 1B, 1C, 1D | | | | SDM | FIVR 0A, 0B, 02C, 0D |

SYSTEMS AND METHODS FOR ROUTING DATA ACROSS REGIONS OF AN INTEGRATED CIRCUIT

BACKGROUND

This disclosure relates to enabling different regions of an integrated circuit to power down while maintaining the functionalities of other regions of the same integrated circuit that are not powered down. More specifically, the disclosure relates to providing systems and methods to route various types of data across different regions of a programmable logic device, such as a field programmable gate array (FPGA) device, regardless of whether programmable logic device includes certain regions that have been powered down.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

An integrated circuit that contains programmable logic fabric provides a highly flexible platform that can be configured after manufacturing with a custom circuit design. The flexibility and variability in the possible designs that may be programmed into this type of integrated circuit, however, also provides for different regions of the integrated circuit to be used for different purposes and functions. As the integrated circuit is programmed to perform various operations, different regions of the integrated circuit may be active or consuming dynamic power at different times. However, the integrated circuit often consumes static power even when a respective region of the integrated circuit is not performing an operation. As such, it may be useful to power down the portions of the integrated circuit that are not actively performing an operation to reduce the amount of static power consumed by the integrated circuit. However, since different regions of the same integrated circuit often depend on each other to perform their respective operations, powering down some regions of the integrated circuit may affect the ability of other powered-on regions of the integrated circuit to perform their respective operations.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

This disclosure relates generally to enabling different regions of an integrated circuit to continue to operate while powering down other regions of the same integrated circuit. In certain embodiments, power circuit components (e.g., fully integrated voltage regulators (FIVRs)) may be disposed on the integrated circuit to independently control the power consumption of different regions of the integrated circuit. That is, the power circuit components may provide power to different regions of the integrated circuit, thereby enabling some regions of the integrated circuit to power down while others remain powered on. However, upon removing the power to certain regions of the integrated circuit, configuration routing architecture for transmitting configuration bits to different regions of the integrated circuit should provide access to various regions of the integrated circuit without being routed through the powered down region. In addition a region, which remains powered assigned a functional behavior, may need to communicate with another portion of the device such as the periphery to access to IO (independent of configuration). As such, because the different regions of the integrated circuit depend on each other to transmit configuration bits and other data across the integrated circuit, to provide clock signals to different regions of the integrated circuit, and the like, it may prove challenging to continue to communicate various types of data across the integrated circuit when certain regions of the integrated circuit are powered down.

With the foregoing in mind, the present disclosure details a number of embodiments in which different regions of an integrated circuit may be powered down while maintaining the functionalities of other regions on the integrated circuit. That is, the embodiments described herein include a number or ways to remove or circumvent the dependencies between different regions of the integrated circuit, such that various types of data can be routed across the integrated circuit even when portions of the integrated circuit are powered down.

By way of example, in one embodiment, configuration routing lanes of the integrated circuit may be designed to access the various regions of the integrated circuit from the outer edges of the integrated circuit towards the center of the integrated circuit. In certain embodiments, a microcontroller (e.g., secure device manager (SDM)) associated with the integrated circuit may determine which regions of the integrated circuit are used more often and may relocate (e.g., via reprogramming) different regions of the integrated circuit such that the lesser used regions of the integrated circuit are located towards the center of the integrated circuit and the regions of the integrated circuit that are used more often are located closer to the outer edges of the integrated circuit. As such, when the lesser used regions of the integrated circuit are powered down, the other regions of the integrated circuit may still be accessed via configuration routing lanes disposed around the outer edges of the integrated circuit.

In another embodiment, a horizontal configuration routing lane may be disposed across the top of the integrated circuit to allow outer regions of the integrated circuit to be reached when inner regions are powered off. As such, the configuration of a particular region of the integrated circuit may still be performed by routing the configuration bits across the horizontal routing lane, thereby avoiding any routes that may traverse the powered down regions.

In addition to providing different configuration routing lanes, the present embodiments described herein include using a clock routing model to enable the powered regions of the integrated circuit to have access to a clock signal when other regions of the integrated circuit are powered down. That is, a global clock signal distributed across the integrated circuit may not be accessible to certain regions of the integrated circuit via other powered off regions of the integrated circuit. As such, in one embodiment, a number of clock network on chip (CNOC) segments may be incorporated into edge circuitry (e.g., wires) of the different regions of the integrated circuit. Each CNOC segment may provide an asynchronous clock signal to a different set of regions in the integrated circuit. As such, different regions of the integrated circuit may use a different clock signal to perform their respective operation without the use of a global clock signal distributed throughout the integrated circuit.

In addition to providing access to clock signals, the present embodiments described herein include isolating powered down regions from powered regions of the integrated circuit to prevent leakage between two regions of the integrated circuit. In one embodiment, pass gates (e.g., transistors) may be incorporated between each programmable logic region 32 to maintain communication and configuration routing between powered regions of the integrated circuit and to prevent leakage between powered down and powered regions of the integrated circuit.

In some embodiments, the integrated circuit may include a general purpose network on chip (NOC) that is continuously powered on, such that it may communicate configuration data and/or user data to regions of the integrated circuit that may be inaccessible via the configuration routing lanes described above. The general purpose NOC may be disposed on the integrated circuit along each horizontal border of the regions of the integrated circuit, each vertical border of the regions of the integrated circuit, and the like. Since the general purpose NOC may be distributed across the integrated circuit and may be independent of operation of the regions of the integrated circuit, the general purpose NOC may communicate data (e.g., user data) between different regions of the integrated devices, to components located at the periphery of the integrated circuit, with components located on other integrated circuits, and the like regardless of the locations of powered down regions of the integrated circuit. Additional details with regard to the embodiments described above will be provided below with reference to FIGS. 1-8.

Various refinements of the features noted above may be made in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. Again, the brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which:

FIG. 7 is a diagram of an integrated circuit with a network on chip (NOC) that routes power between programmable logic regions, in accordance with an embodiment of the present disclosure; and FIG. 8 is an example diagram of groups of programmable logic regions in an integrated circuit, in accordance with an embodiment of the present disclosure.

DETAILED DESCRIPTION OF SPECIFIC EMBODIMENTS

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

An integrated circuit consumes power when in operation, such as when implementing a design programmed in the integrated circuit. Generally, the integrated circuit will become less expensive to operate as it consumes less power. Moreover, less power consumption results in less heat dissipation, enabling the integrated circuit to operate at a cooler temperature. As a result, manufacturers may include more components on the integrated circuit and/or more tightly pack components on the integrated circuit. Furthermore, cooler operating temperatures increase the lifetime of the integrated circuit. Additionally, in cases where the power source of the integrated circuit is a battery, lower power consumption translates to longer battery life and/or smaller footprint of the battery (e.g., on a printed circuit board).

With this in mind, to reduce the power consumed by an integrated circuit, it may be useful to power down different regions of the integrated circuit that may not be in use. By way of example, an integrated circuit may be divided into multiple regions, such that different regions may be used to perform a variety of operations. To program each region of the integrated circuit, configuration data may be routed to each region via a configuration routing system to implement various designs in various regions of the integrated circuit. In addition, because each region may be employed for different operations, the integrated circuit may include one or more routed paths (e.g., circuit paths that connect components of the integrated circuit together using connective components such as wires) that allows for communication of user logic data from certain regions of the integrated circuit to components that may be accessible via the periphery of the integrated circuit. With this in mind, as mentioned above, when different regions of the integrated circuit are powered down, communicating configuration data and/or user logic data may become challenging. As such, the embodiments disclosed in the present disclosure include systems and methods for routing data across the integrated circuit regardless of whether regions of the integrated circuit is powered down or on.

Figure 1:
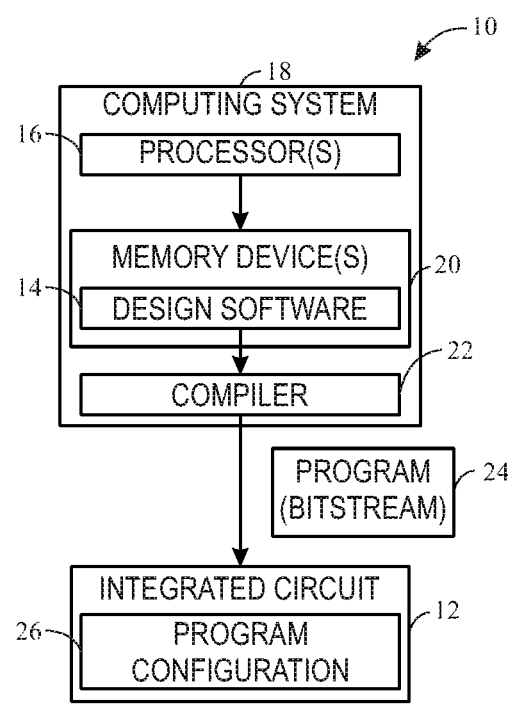
FIG. 1 illustrates a block diagram of a system that may reduce power consumption in each region of an integrated circuit based on a design programmed in the integrated circuit while providing sufficient speed to operate the integrated circuit, in accordance with an embodiment of the present disclosure.

By way of introduction, FIG. 1 illustrates a block diagram of a system 10 that may reduce power consumption in each region of an integrated circuit 12 based on a design programmed in the integrated circuit 12, in accordance with an embodiment of the present disclosure. The integrated circuit 12 may be reconfigurable (e.g., a field programmable gate array (FPGA)). A user may implement a circuit design to be programmed onto the integrated circuit 12 using design software 14, such as a version of Quartus by Intel.

The design software 14 may be executed by one or more processors 16 of a computing system 18. The computing system 18 may include any suitable device capable of executing the design software 14, such as a desktop computer, a laptop, a mobile electronic device, a server, and the like. The computing system 18 may access, configure, and/or communicate with the integrated circuit 12. The processor(s) 16 may include multiple microprocessors, one or more other integrated circuits (e.g., application specific integrated circuits, field programmable gate arrays, reduced instruction set processors, and the like), or some combination thereof.

One or more memory devices 20 may store the design software 14. In addition, the memory device(s) 20 may store information related to the integrated circuit 12, such as control software, configuration software, look up tables, configuration data, etc. In some embodiments, the processor(s) 16 and/or the memory device(s) 20 may be external to the computing system 18. The memory device(s) 20 may include a tangible, non-transitory, machine-readable-medium, such as a volatile memory (e.g., a random access memory (RAM)) and/or a nonvolatile memory (e.g., a read-only memory (ROM)). The memory device(s) 20 may store a variety of information and be used for various purposes. For example, the memory device(s) 20 may store machine-readable and/or processor-executable instructions (e.g., firmware or software) for the processor(s) 16 to execute, such as instructions to determine a speed of the integrated circuit 12 or a region of the integrated circuit 12, determine a criticality of a path of a design programmed in the integrated circuit 12 or a region of the integrated circuit 12, programming the design in the integrated circuit 12 or a region of the integrated circuit 12, and the like. The memory device(s) 20 may include one or more storage devices (e.g., nonvolatile storage devices) that may include read-only memory (ROM), flash memory, a hard drive, or any other suitable optical, magnetic, or solid-state storage medium, or any combination thereof.

The design software 14 may use a compiler 22 to generate a low-level circuit-design program 24 (bitstream), sometimes known as a program object file, which programs the integrated circuit 12. That is, the compiler 22 may provide machine-readable instructions representative of the circuit design to the integrated circuit 12. For example, the integrated circuit 12 may receive one or more programs 24 (bitstreams) that describe the hardware implementations that should be stored in the integrated circuit 12. The programs 24 (bitstreams) may programmed into the integrated circuit 12 as a configuration program 26. The configuration program 26 may be represented as "configuration data" that is routed to various regions of the programmable logic device, even when one or more of those regions are powered down.

Figure 2:
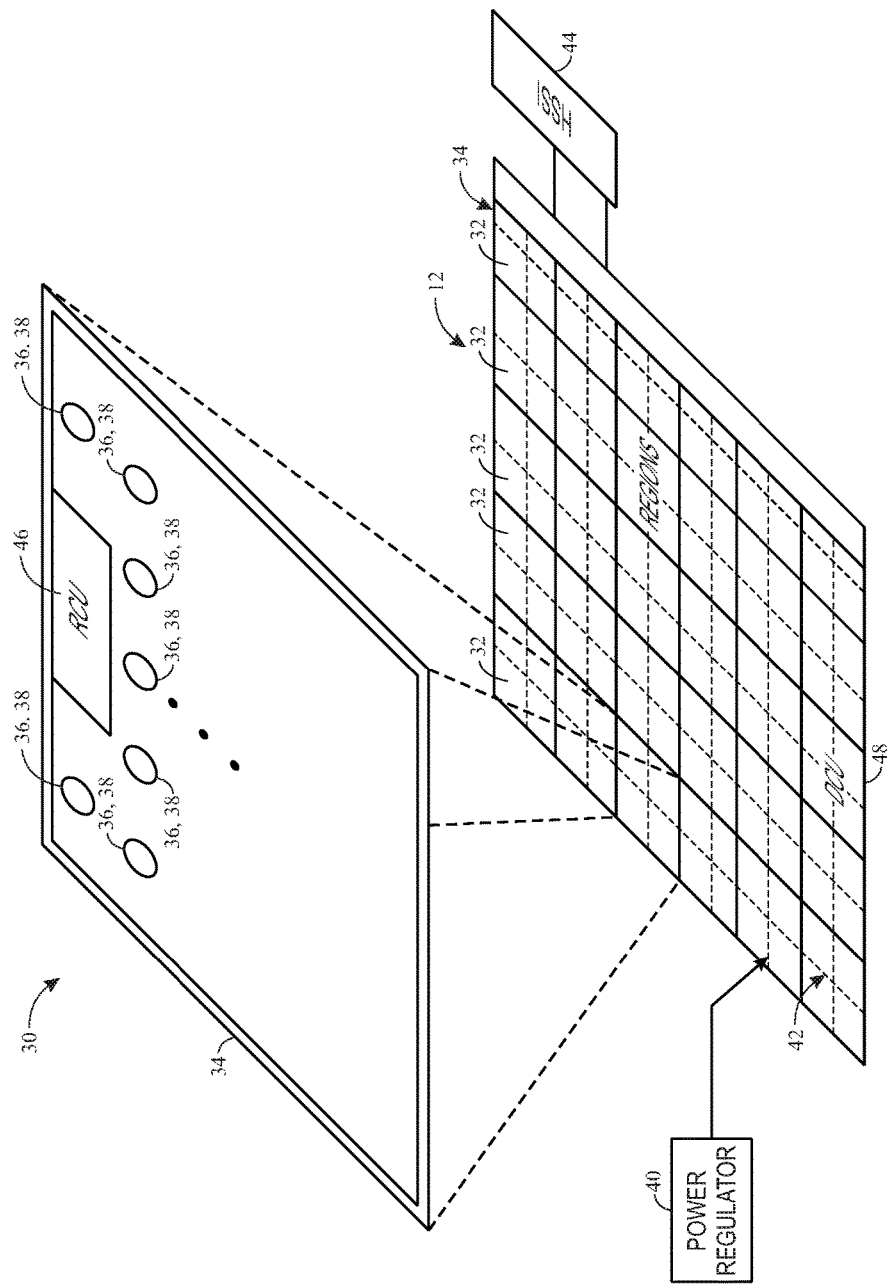
FIG. 2 is a diagram of a system that includes an integrated circuit, in accordance with an embodiment of the present disclosure.

FIG. 2 is a diagram of a system 30 that illustrates regions 32 of the integrated circuit 12 of FIG. 1, in accordance with an embodiment of the present disclosure. As illustrated, the integrated circuit 12 is a programmable circuit, such as a field programmable gate array device. In alternative embodiments, the integrated circuit 12 may be an application-specific integrated circuit, an application-specific standard part, a System-on-Chip, and the like. The system 30 may be used in any suitable application, such as a data center, network device, server, router, switch, gateway, firewall, bridge, hub, database, workstation, desktop computer, laptop computer, mobile device, wireless access point, wireless access device, and the like.

Interconnection resources 34 may be used to route signals, such as clock or data signals, through the integrated circuit 12. The integrated circuit 12 of FIG. 2, in one embodiment, may be a sectorized FPGA of the type described in U.S. Application No. 20160049941, "Programmable Circuit Having Multiple Sectors," which is incorporated by reference in its entirety for all purposes. As such programmable logic resources or blocks of the integrated circuit 12 may be distributed through a number of discrete programmable logic sectors or regions 32. Each programmable logic region 32 may include a number of programmable logic elements 36 having operations defined by configuration memory 38 (e.g., configuration random access memory). The programmable logic elements 36 may include combinational or sequential logic circuitry. For example, the programmable logic elements 36 may include look-up tables, registers, multiplexers, routing wires, and so forth. A user may program the programmable logic elements 36 to perform a variety of desired functions. A power or voltage regulator 40 (including a power supply) may provide a source of voltage and current to a power distribution network (PDN) 42 that distributes electrical power to the various components of the integrated circuit 12. Operating the circuitry of the integrated circuit 12 causes power to be drawn from the power distribution network 42. The integrated circuit 12 may include transceiver circuitry 44 (e.g., high speed serial interface circuitry) for driving signals off of the integrated circuit 12 and for receiving signals from other devices.

There may be any suitable number of programmable logic regions 32 on the integrated circuit 12. Indeed, while 29 programmable logic regions 32 are shown in FIG. 2, it should be appreciated that more or fewer may appear in an actual implementation (e.g., in some cases, on the order of 50 to 100 regions or more). Each programmable logic regions 32 may include a regional or sector control unit or circuit (RCU) 46 that controls the operation of the programmable logic sector 32. Each regional control circuit 46 may be in communication with a device control unit or circuit (DCU) 48. Each regional control circuit 46 may accept commands and data from the device control circuit 48, and may read data from and write data into its configuration memory 38 based on control signals from the device control circuit 48. In addition to these operations, the regional control circuit 46 may be augmented with numerous additional capabilities. For example, such capabilities may include locally sequencing reads and writes to implement error detection and correction on the configuration memory 38 and sequencing test control signals to effect various test modes.

The regional control circuits 46 and the device control circuit 48 may be implemented as logic circuits, such as state machines and/or processors. For example, each operation of the regional control circuits 46 or the device control circuit 48 may be implemented as a separate routine in a memory containing a control program. This control program memory may be fixed in a read-only memory (ROM) or stored in a writable memory, such as random access memory (RAM). The ROM may have a size larger than would be used to store only one copy of each routine. This may allow each routine to have multiple variants depending on "modes" the local controller may be placed into. When the control program memory is implemented as random access memory (RAM), the RAM may be written with new routines to implement new operations and functionality into the programmable logic regions 32. This may provide usable extensibility in an efficient and easily understood way. This may be useful because new commands could bring about large amounts of local activity within the region at the expense of only a small amount of communication between the device control circuit 48 and the regional control circuits 46.

Each regional control circuit 46 thus may communicate with the device control circuit 48, which may coordinate the operations of the regional control circuits 46 and convey commands initiated from outside the integrated circuit 12. To support this communication, the interconnection resources 34 may act as a network between the device control circuit 48 and each regional control circuit 46. The interconnection resources 34 may support a wide variety of signals between the device control circuit 48 and each regional control circuit 46. In one example, these signals may be transmitted as communication packets.

The integrated circuit 12 may be electrically programmed. With electrical programming arrangements, the programmable elements 36 may include one or more logic elements (wires, gates, registers, etc.). For example, during programming, configuration data is loaded into the configuration memory 38 using pins and/or input/output circuitry (e.g., of the transceiver circuitry 44) of the integrated circuit 12. In one example, the configuration memory 38 may be implemented as configuration random-access-memory cells. The use of configuration memory 38 based on RAM technology is described herein is intended to be only one example. Moreover, configuration memory 38 may be distributed (e.g., as RAM cells) throughout the various programmable logic regions 36 the integrated circuit 12. The configuration memory 38 may provide a corresponding static control output signal that controls the state of an associated programmable logic element 36 or programmable component of the interconnection resources 34. The output signals of the configuration memory 38 may configure the may be applied to the gates of metal-oxide-semiconductor (MOS) transistors that control the states of the programmable logic elements 36 or programmable components of the interconnection resources 34.

Figure 3:
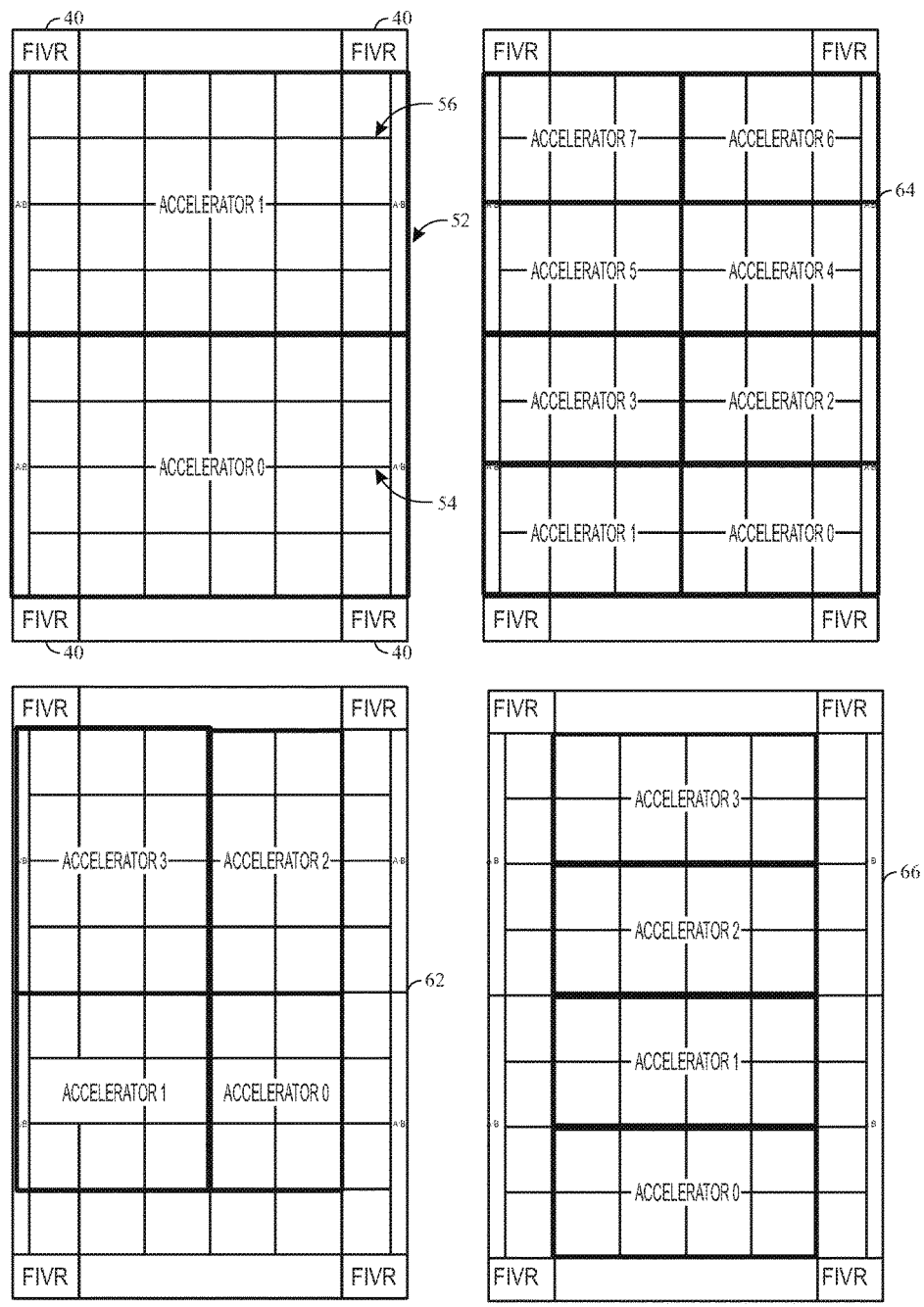
FIG. 3 is a diagram of four embodiments in which regions of an integrated circuit are grouped together to perform different respective operations, in accordance with an embodiment of the present disclosure.

With the foregoing in mind, FIG. 3 illustrates example embodiments in which regions of the integrated circuit 12 may be used for different operations. For example, integrated circuit 52 may include region 54 and region 56, which may be used as two different accelerator circuits. In certain embodiments, the integrated circuit 52 may also include power regulators 40 at each corner of the integrated circuit. In one embodiment, the power regulator 40 may include a fully-integrated voltage regulator (FIVR) circuit that provides for control of voltage applied to a respective region of the integrated circuit 52.

Although the integrated circuit 52 is illustrated as having two regions, it should be understood that the integrated circuit 52 may be programmed to include any suitable number of regions. By way of example, integrated circuit 62, 64, and 66 illustrate other examples in which regions of the integrated circuit may be organized. In addition, it should be noted that the integrated circuits 52, 62, 64, and 66 may be organized into regions to perform a variety of suitable operations and are not limited to accelerators as shown in FIG. 3.

Although using different regions of the integrated circuit 12 provides for a flexible circuit that can be employed for a variety of tasks, power is generally provided to each region regardless of whether the region is actively being used to perform operations or not. Indeed, even when a region of the integrated circuit 12 is not actively being used to perform a respective operation, the static power consumed by the respective region of the integrated circuit 12 may prove to be significant (e.g., 20 watts). As such, the regional control unit 46 or similar component may power down a respective region of the integrated circuit 12 when the respective region is not being used to perform an operation. By powering down or removing the access to voltage from the respective region of the integrated circuit 12, the regional control unit 46 may avoid consuming static power to keep the respective region powered on. This recovered power by reducing the static power consumed by the integrated circuit 12 allows for more power to be consumed by other regions of the integrated circuit 12 that are actively performing certain operations (e.g., accelerator operations).

Figure 4:
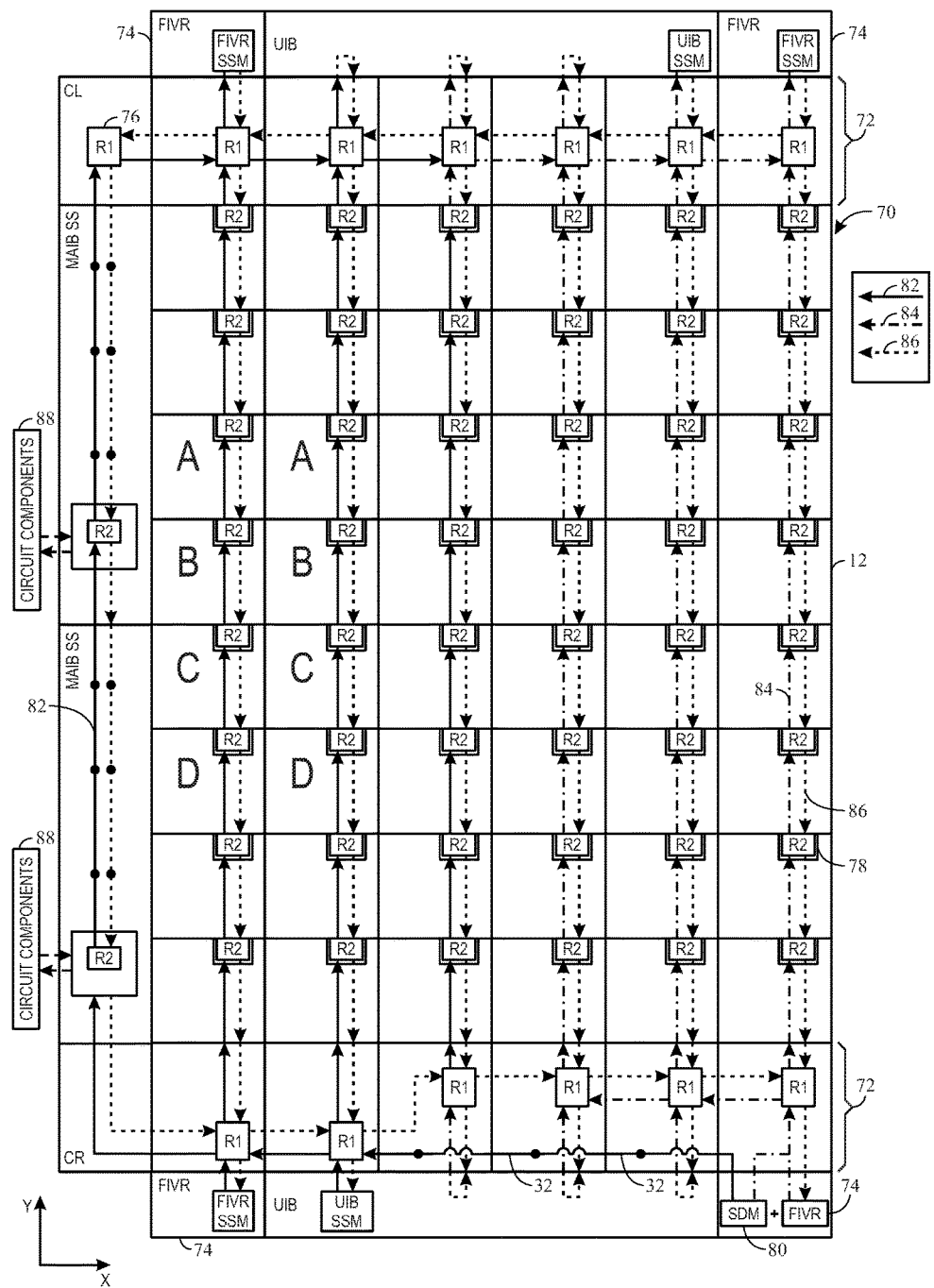
FIG. 4 is a diagram of a configuration routing system for an integrated circuit, in accordance with an embodiment of the present disclosure.

With the foregoing in mind, FIG. 4 illustrates an example configuration routing system 70 that may be incorporated into the integrated circuit 12 that provides for communication of configuration data to different programmable logic regions 32 while avoiding powered down programmable logic regions 32. The configuration routing system 70 may include one or more horizontal routes 72 to enable communication access to outer programmable logic regions 32, which may in turn be used to provide communication access to inner programmable logic regions 32. Although the following descriptions of the integrated circuit 12 is provided with respect to programmable logic regions 32, it should be noted that the embodiments discussed throughout this disclosure may be performed on programmable logic elements 36 as well.

By way of example, when programmable logic regions 32 located towards the center of the integrated circuit 12 are powered down, configuration data may be transmitted to different programmable logic regions 32 located around the center of the integrated circuit 12 via the configuration routing system 70. With this in mind, when programming the programmable logic regions 32 of the integrated circuit, it may be beneficial to program programmable logic regions 32 located near the center of the integrated circuit 12 to perform operations that are used less frequently as compared to the programmable logic regions 32 located near the top or bottom edges of the integrated circuit 12. In this way, the less frequently used programmable logic regions 32 may be powered down, and the configuration routing system 70 may still enable configuration bits to access the other more frequently used programmable logic regions 32. Indeed, in certain embodiments, the programmable logic regions 32 may be reprogrammed or reorganized at different times, such that programmable logic regions 32 that are positioned closer to the outer edge (e.g., top edge, bottom edge) of the integrated circuit 12 are used more frequently than the programmable logic regions 32 that are positioned near the center of the integrated circuit 12.

Keeping the foregoing in mind and referring to FIG. 4, the programmable logic regions 32 labeled "A" may be used 50% of a certain period of time, while the programmable logic regions 32 labeled "B" may be used 25% of the same period of time. As such, to improve the power efficiency of the integrated circuit 12, it may be useful to power down the A and B programmable logic regions 32 when they are not actively performing an operation and consuming dynamic power.

The power for each programmable logic region 32 may be distributed thereto via a respective fully integrated voltage regulator (FIVR) 74. The FIVR 74 may control the power distribution to each of the programmable logic regions 32 of the integrated circuit 12. However, when a particular programmable logic region 32 is powered down, configuration data may not be communicated via the powered off programmable logic region 32. As such, the configuration routing system 70 may provide an alternate manner to communicate configuration data to certain programmable logic regions 32 while other programmable logic regions 32 are powered off.

Although the FIVRs 74 is illustrated on each corner of the integrated circuit 12 of FIG. 4, it should be noted that the FIVRs 74 may, in some embodiments, be located off-chip or separate from the integrated circuit 12. In other embodiments, an individual FIVR 74 may be embedded within each programmable logic region 32.

To facilitate communication between the programmable logic regions 32, the configuration routing system 70 may include R1 routers 76 and R2 routers 78. The R1 routers 76 may be programmed to define horizontal and vertical (e.g., XY) routing paths of an outgoing packet that may be received as the program 26 via the compiler 22 or the like. In certain embodiments, the R1 routers may be programmed to define priorities for return paths for data.

The R2 routers 78 may be programmed to route packets through programmable logic regions 32 and return packets (e.g., configuration data packets) via return paths. By employing R2 routers 78 that may return packets back to a return path, the integrated circuit 12 may allow packets to be returned without the initial data packets being communicated through un-powered programmable logic regions 32. In addition, the R2 routers 78 may interface with circuit components 88 that may be separate from the integrated circuit 12. For instance, the circuit components 88 may include high speed transceivers, high speed memory devices, processors (e.g., Xeon processors), and other circuit devices that may be coupled to the integrated circuit 12.

In certain embodiments, communications within the integrated circuit 12 may be managed or coordinated via a secure device manager (SDM) 80. The SDM 80 may be a microcontroller or microprocessor that controls the communication of data via a network on chip (NOC) of the integrated circuit 12. In the configuration routing system 70, the NOC may include two configuration network on chip (CNOC) segments that facilitate configuration data communication to two halves of the integrated circuit 12. That is CNOC segments 82 may transmit data to the programmable logic regions 32 disposed on the left side of the integrated circuit 12, and CNOC segments 84 may transmit configuration data to the programmable logic regions 32 disposed on the right side of the integrated circuit 12. Although the CNOC segments 82 and 84 are illustrated with arrows in one direction, it should be noted that the CNOC segments 82 and 84 may be bi-directional or programmed to communicate in other suitable directions.

In addition, the SDM 80 may coordinate the powering off of certain programmable logic regions 32 via the FIVR 74. As such, in certain embodiments, the SDM 80 may monitor the operations of the integrated circuit 12 and identify when certain programmable logic regions 32 are not active. The SDM 80 may then coordinate with a respective FIVR 74 to power down the identified programmable logic regions 32 when they are not active to preserve static power.

With the foregoing in mind, if programmable logic regions B and C are powered off, the SDM 80 may employ CNOC segments 82 to send configuration data to programmable logic region D via the bottom of the integrated circuit 12 using R1 routers 76 at the bottom of the integrated circuit 12 and intervening R2 routers 78. In the same manner, the SDM 80 may employ CNOC segments 82 to send configuration data to programmable logic region A via the top of the integrated circuit 12 using R1 routers 76 disposed at the top of the integrated circuit 12 and intervening R2 routers 78. Since the programmable logic regions B and C are powered off, programmable logic regions A and D may terminate the NOC of the integrated circuit 12 and wrap incoming packets back to the SDM 80 via CNOC return paths 86.

By employing the configuration routing system 70, the SDM 80 may re-define routing paths to different programmable logic regions 32 as various programmable logic regions 23 are powered down. In some embodiment, the SDM 80 may monitor the operations or activities of each respective programmable logic region 32 and relocate certain operations based on the operations. That is, the SDM 80 may program the innermost or center programmable logic regions 32 of the integrated circuit 12 to perform operations that are used less frequently than others. As such, the configuration routing system 70 may efficiently enable communication between programmable logic regions 32 while powering down certain programmable logic regions 32.

Figure 5:
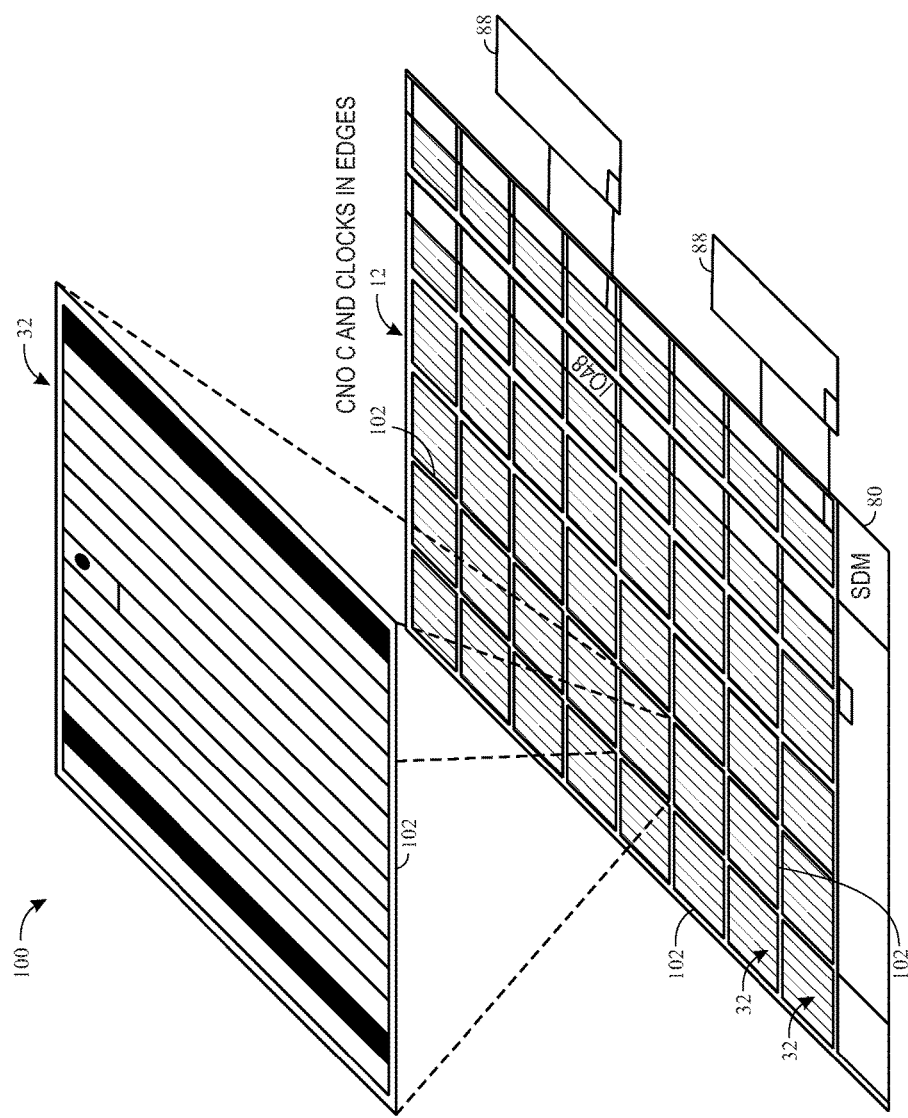
FIG. 5 is a diagram of an integrated circuit with clock signals routed between programmable logic regions, in accordance with an embodiment of the present disclosure.

In addition to the configuration routing system 70 described above, a clock network system 100, as shown in FIG. 5, may also be incorporated into the integrated circuit 12 to ensure that various programmable logic regions 32 may receive clock signals to perform respective operations regardless of whether certain programmable logic regions 32 are powered off or not. That is, instead of a global clock signal distributed throughout the integrated circuit 12, the SDM 80 may provide a number of asynchronous clock signals to different programmable logic regions 32 via CNOC segments 82, CNOC segments 84, or other CNOC segments. As such, in certain embodiments, clock signals may be transmitted via edge circuitry 102 (e.g., wires) of the programmable logic regions 32.

As shown in FIG. 5, the edge circuitry 102 may be disposed between each programmable logic region 32, such that it may form a mesh network across the integrated circuit 12. In this way, when programmable logic regions 32 located proximate to the center of the integrated circuit 12 are powered down, the SDM 80 may still distribute the clock signals to the powered-on programmable logic regions 32 via the CNOC segments 82 and 84. Although the integrated circuit 12 of FIG. 4 is shown as having two CNOC segments one CNOC return path, it should be noted that embodiments described herein may have any suitable number of CNOC segments and CNOC return paths.

In addition to providing a global clock signal to the programmable logic regions 32, it should be noted that separately power-able programmable logic regions 32 that are designed to perform different operations (e.g., accelerators) may use unaligned phase clocks to perform their respective operations. That is, different programmable logic regions 32 may operate independently of each other without sharing a phase-aligned clock. With this in mind, in some embodiments, the SDM 80 may generate a number of asynchronous clock signals with the program 24. The SDM 80 may distribute the asynchronous clock signals to different portions of the integrated circuit 12 via the CNOC segments 82 and/or 84. As such, different portions of the integrated circuit 12 may have different asynchronous clock signals distributed to a respective portion of the edge circuitry 102.

To increase flexibility in providing asynchronous clock signals to the different portions of the edge circuitry 102, the clock signals may be bidirectional. In addition, in some embodiments, tri-state global clocks may be integrated at boundaries of one or more programmable logic regions 32. The tri-state global clocks may output no signal (e.g., 0), a clock signal (e.g., 1), or a high impedance value (e.g., Z). When one or more programmable logic regions 32 are powered down, the global clock associated with the respective regions may be switched to a no signal output or a high impedance output. The high impedance output may allow another clock signal to drive the respective programmable logic region 32.

With the foregoing in mind, the wires used between different programmable logic regions 32 may also be capable of being tri-stated. That is, the wires between programmable logic regions 32 may be coupled to a circuit component that causes the respective wires to output a corresponding signal provided thereto, a zero value, or a high-impedance value. When the wire outputs the high-impedance value, the respective programmable logic region 32 may allow another programmable logic region 32 to drive the respective wire.

In addition to using tri-state wire techniques, in some embodiments, pass gates (e.g., transistors) may be incorporated between each programmable logic region 32 to maintain communication and configuration routing between powered regions of the integrated circuit and to prevent leakage between powered down and powered regions of the integrated circuit. Generally, a multitude of wires may connect different regions of the integrated circuit to each other for fabric (e.g., soft logic) interconnect. By incorporating pass gates at these intersections, the wires connecting these different regions may be immune or unaffected by the powering down of regions located at the outer edges of the integrated circuit. In other words, at boundaries where powered regions of the integrated circuit meet unpowered regions of the integrated circuit, the pass gate may provide a mechanism to isolate and prevent signals from leaking from powered regions to unpowered regions.

With this in mind, the wires used between different programmable logic regions 32 may be connected to each other via a pass gate. The pass gates may isolate power between programmable logic regions 32 regardless of the location of the programmable logic regions 32. Moreover, the pass gates between programmable logic regions 32 may prevent leakage current from the powered-on programmable logic region 32 from trickling into the powered-off programmable logic region 32. By way of example, FIG. 6 illustrates example pass gates that may be employed between powered-up and powered-down regions.

Figure 6:
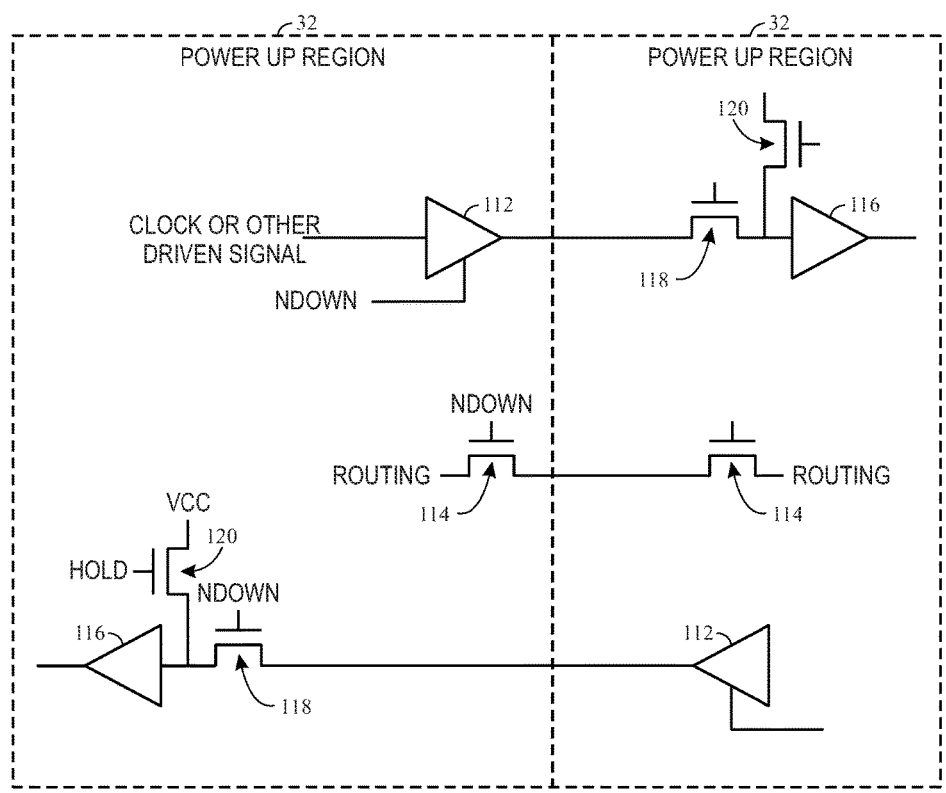
FIG. 6 is an example circuit diagram for use between programmable logic regions of an integrated circuit, in accordance with an embodiment of the present disclosure.

Referring now to FIG. 6, multiple pass gate embodiments are illustrated. In one embodiment, a clock signal or other drive signal may be provided to a buffer/driver component 112, which may pass the clock signal or drive signal to the adjacent programmable logic region 32. However, when the adjacent programmable logic region 32 is powered down, an ndown signal may be applied to the buffer/driver component 112 to prevent the clock signal or drive signal from leaving the powered up programmable logic region 32. That is, the ndown signal may cause the buffer/driver component 112 to open thereby preventing any leakage current from leaving the powered up programmable logic region 32 to the powered down programmable logic region 32.

In the same way, a pass gate component 114 (e.g., transistor, switch) may be employed to route data (e.g., configuration data) between programmable logic regions 32. However, when the adjacent programmable logic region 32 is powered down, an ndown signal may be provided to the pass gate component 114 thereby opening the pass gate component 114 and preventing data from exiting powered up programmable logic region 32.

In yet another embodiment, power may be distributed between programmable logic regions 32 via a buffer/driver 116. When the adjacent programmable logic region 32 is powered down, an ndown signal may be provided to a pass gate component 118 (e.g., transistor) thereby opening a circuit connection between the two programmable logic regions 32. As a result, the powered up programmable logic region 32 may not receive power via the adjacent programmable logic region 32; instead, a voltage source (e.g., VCC) may be provided to the buffer/driver 116 via a pass gate component 120. When the adjacent programmable logic region 32 is providing power to the respective programmable logic region 32, a hold signal may be provided to the pass gate component 120. The hold signal may be used to guarantee an input signal on the buffer rather than letting it float because floating CMOS inputs may draw excess current. In addition, the ndown signal may be removed from the pass gate component 118 thereby connecting the buffer/driver 116 to the power provided via the adjacent programmable logic region 32.

With the foregoing in mind, as different programmable logic regions 32 or groups of programmable logic regions 32 are powered on or off or operating at variable voltages, the buffer/driver 112, 116 and pass gates 114, 118, 120 may be configured to prevent or allow power, clock signals, data, and the like to be transmitted between programmable logic regions 32 in accordance with the respective powered states. In some embodiments, if the powered on and powered off programmable logic regions 32 are not known when the integrated circuit 12 is initialized, the computing system 18, the regional control circuit 46, or the device control circuit 48 may send configuration data to the respective pass gates and switch components to isolate the powered on programmable logic regions 32 from the powered off programmable logic regions 32 prior to powering down particular programmable logic regions 32.

Since the use of tri-state wiring techniques and pass gates may isolate communication between powered off programmable logic regions 32 and powered on programmable logic regions 32, the integrated circuit 12 may include a general purpose network on chip (NOC) that may be distributed between the programmable logic regions 32 at horizontal and/or vertical borders of the programmable logic regions 32. As such, the general purpose NOC may enable data (e.g., configuration data, user data) to be communicated between different powered programmable logic regions 32 regardless of whether an unpowered programmable logic region 32 is disposed between the powered programmable logic regions 32. That is, certain operations being performed by powered programmable logic regions 32 may involve communicating user or logic data between the powered programmable logic regions 32, to other integrated circuits 12, to programmable logic regions 32 located at the periphery of the integrated circuit 12, or the like. To enable the powered programmable logic regions 32 to communicate data (e.g., other than configuration data) between each other or with other components when powered down programmable logic regions 32 are disposed between them, the general purpose NOC may be continuously powered on, such that it communicate packets of data between different programmable logic regions 32, the components located at the periphery of the integrated circuit 12, and the like via the general purpose NOC.

In addition, in the case that the configuration routing system 70 described above may not enable configuration data to reach certain powered programmable logic regions 32 due to the locations of the powered off programmable logic regions 32, the general NOC described herein may also transmit configuration data. As such, the general NOC eases the problem of accessing certain programmable logic regions 32 that may be inaccessible via the configuration routing system 70 described above.

With the foregoing in mind, FIG. 7 illustrates employing a general purpose network on chip (NOC) 132 that distributes control and configuration data (e.g., bits) across the integrated circuit 12 between each programmable logic region 32. Generally, the NOC 132 may be coupled to any programmable logic region 32 that may be powered on or off. As such, the NOC 132 may continuously provide configuration data across the integrated circuit 12 through powered and unpowered regions of the integrated circuit 12. In addition, the NOC 132 may be clock gated when a portion of the programmable logic regions 21 of the integrated circuit 12 is not receiving data, thereby providing power savings. In some embodiments, the NOC 132 may receive power via one of the FIVRs 122, 124, 126, or 128, a combination of the FIVRs 122, 124, 126, or 128, and the like.

Figure 8:
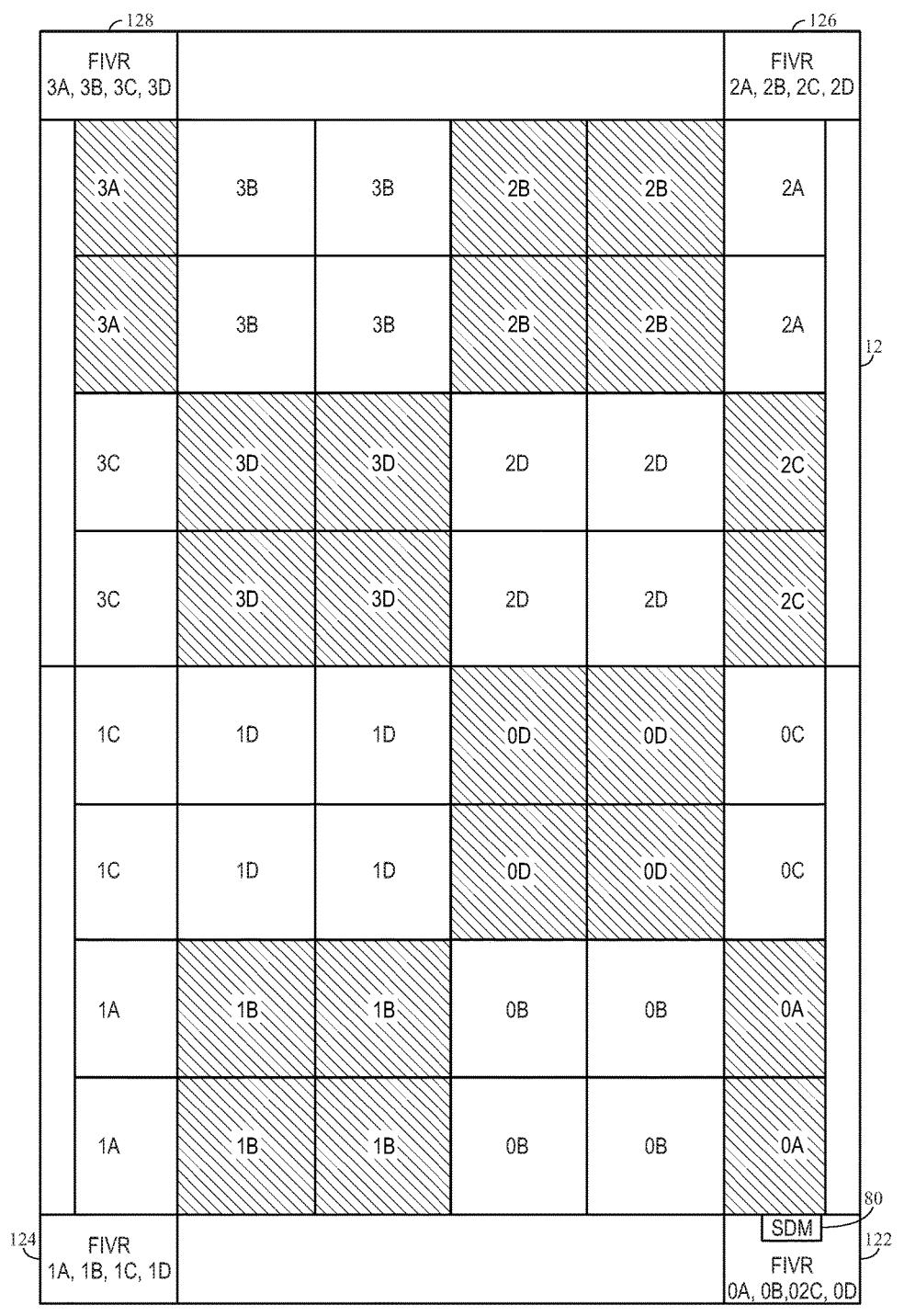

In addition to providing a variety of schemes to communicate configuration data, clock data, and user data, as described above, the integrated circuit 12 may also employ different FIVRs 74 to control different programmable logic regions 32. For example, FIG. 8 illustrates the integrated circuit 12 that may include four different FIVRs to control various programmable logic regions 32. As shown in FIG. 8, FIVR 122 may provide power to the programmable logic regions 32 labeled 0A, 0B, 0C, and 0D. FIVR 124 may provide power to the programmable logic regions 32 labeled 1A, 1B, 1C, and 1D. FIVR 126 may provide power to the programmable logic regions 32 labeled 2A, 2B, 2C, and 2D. FIVR 128 may provide power to the programmable logic regions 32 labeled 3A, 3B, 3C, and 3D. Although FIG. 8 illustrates a particular arrangement in which different programmable logic regions 32 are controlled by different FIVRs. In certain embodiments, the SDM 80 may control each FIVR 122, 124, 126, 128 based on which programmable logic region 32 is powered on. By using different FIVRs to power different programmable logic regions 32, the SDM 80 may provide a more granular control of power distribution to the programmable logic regions 32 across the integrated circuit 12.

By implementing one or more of the foregoing disclosed systems and techniques for routing configuration and user data to different regions (e.g., programmable logic regions 32) of the integrated circuit 12, the integrated circuit 12 may use power more efficiently and provide data to different programmable logic regions 32 to perform respective operations in a variety of different manners. Since the integrated circuit 12 is made up of a number of programmable logic regions 32, there is no defined boundary in which data should be routed across the integrated circuit 12. Indeed, given the ability to power on and power off certain portions of the integrated circuit 12, the presently disclosed techniques may create artificial boundaries within the integrated circuit 12 to define where data may be routed within the integrated circuit 12 while maintaining the ability of the integrated circuit 12 to be used for different operations based on how the integrated circuit 12 is configured.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An integrated circuit comprising:
   a plurality of programmable logic regions;
   a first plurality of routers, wherein each of the first plurality of routers is coupled to a respective programmable logic region of a first portion of the plurality of programmable logic regions, wherein each of the first portion of the plurality of programmable logic regions is configured to transmit configuration data to a first set of adjacent programmable logic regions of the first portion of the plurality of programmable logic regions;
   a second plurality of routers, wherein each of the second plurality of routers is coupled to a respective programmable logic region of a second portion of the plurality of programmable logic regions, wherein each of the second portion of the plurality of programmable logic regions is configured to transmit the configuration data to a second set of adjacent programmable logic regions of the first portion of the plurality of programmable logic regions; and
   at least one voltage regulator configured to distribute a voltage to each of the plurality of programmable logic regions.

2. The integrated circuit of claim 1, wherein each region of the plurality of regions comprises a plurality of logic blocks configured to perform an operation.

3. The integrated circuit of claim 1, comprising:
   a third plurality of routers, wherein each of the third plurality of routers is coupled to a respective programmable logic region of a third portion of the plurality of programmable logic regions, wherein each of the third portion of the plurality of programmable logic regions is configured to transmit the configuration data to a third set of adjacent programmable logic regions of the third portion of the plurality of programmable logic regions, and wherein the first portion of the plurality of programmable logic regions is positioned at a top of the integrated circuit.

4. The integrated circuit of claim 3, wherein the third portion of the plurality of programmable logic regions is positioned at a bottom of the integrated circuit.

5. The integrated circuit of claim 1, comprising a processor configured to:

identify a third portion of the plurality of programmable logic regions that is used more frequently than a fourth portion of the plurality of programmable logic regions, wherein the fourth portion of the plurality of programmable logic regions is located closer to a center of the integrated circuit than the third portion of the plurality of programmable logic regions; and relocate the third portion of the plurality of programmable logic regions to a location where the fourth portion of the plurality of programmable logic regions is located.

6. The integrated circuit of claim 1, wherein a first subset of the plurality of the programmable logic regions is located at a center of the integrated circuit, and wherein a second subset of the plurality of programmable logic regions is located towards an upper or lower edge of the integrated circuit, wherein the first subset of the plurality of programmable logic regions is used less frequently than the second subset of the plurality of programmable logic regions.

7. The integrated circuit of claim 1, wherein the at least one voltage regulator comprises:
a first voltage regulator configured to provide the voltage to a third portion of the plurality of programmable logic regions; and
a second voltage regulator configured to provide the voltage to a fourth portion of the plurality of programmable logic regions, wherein the third portion and the fourth portion are distinct from each other.

8. The integrated circuit of claim 1, comprising a pass gate between each adjacent programmable logic region of the plurality of logic regions.

9. The integrated circuit of claim 8, wherein the pass gate is configured to transmit one or more clock signals, power, or data.

10. The integrated circuit of claim 1, comprising a clock network system disposed between each of the plurality of programmable logic regions, wherein the clock network system is configured to distribute a plurality of asynchronous clock signals to different portions of the plurality of programmable logic regions.

11. The integrated circuit of claim 10, wherein the clock network system is disposed within edge circuitry of the plurality of programmable logic regions.

12. The integrated circuit of claim 1, comprising a network on chip system disposed between each of the plurality of programmable logic regions, wherein the network on chip system is configured to route the configuration data or user data to at least one of the plurality of programmable logic regions or to a periphery of the integrated circuit.

13. An integrated circuit comprising:
a plurality of regions, wherein each of the plurality of regions comprises one or more programmable logic elements;
a control circuit configured to control a first power regulator configured to provide a first voltage to a first portion of the plurality of regions; and
a clock network distributed around each of the plurality of regions, wherein the clock network is configured to provide a plurality of asynchronous clock signals to at least two different regions of the plurality of regions, and wherein the clock network is configured to:
provide a first clock signal of the plurality of asynchronous clock signals to a first region of the at least two regions; and
provide a second clock signal of the plurality of asynchronous clock signals to a second region of the at least two regions, wherein the second clock signal is asynchronous with respect to the first clock signal.

14. The integrated circuit of claim 13, wherein the clock network is disposed within edge circuitry between the plurality of regions.

15. The integrated circuit of claim 13, wherein the control circuit is configured to control a second power regulator configured to provide a second voltage to a second portion of the plurality of regions.

16. The integrated circuit of claim 15, comprising pass gate circuitry disposed between each of the plurality of regions, wherein the pass gate circuitry is configured to open a circuit between a first adjacent region and a second adjacent region of the plurality of regions, wherein the first adjacent region is powered on and the second adjacent region is powered off.

17. The integrated circuit of claim 15, comprising pass gate circuitry disposed between each of the plurality of regions, wherein the pass gate circuitry is configured to provide a clock signal, power, or data between a first adjacent region and a second adjacent region of the plurality of regions.

18. An integrated circuit comprising:
a plurality of regions, wherein each of the plurality of regions comprises one or more programmable logic elements;
a clock network distributed around each of the plurality of regions, wherein the clock network is configured to provide a plurality of asynchronous clock signals to different portions of the plurality of regions, wherein the clock network is configured to form a mesh network via edge circuitry disposed around each of the plurality of regions, and wherein the clock network is configured to:
provide a first clock signal of the plurality of asynchronous clock signals to a first region of the at least two regions; and
provide a second clock signal of the plurality of asynchronous clock signals to a second region of the at least two regions, wherein the second clock signal is asynchronous with respect to the first clock signal; and
a network on chip system disposed on edge circuitry around at least two regions of the plurality of regions, wherein the network on chip system is configured to transmit user data between at least two regions of the plurality of regions or to a periphery of the integrated circuit.

19. The integrated circuit of claim 18, comprising a first set of routers configured to transmit configuration data across a first portion of the plurality of regions in a first direction and a second set of routers configured to transmit the data across a second portion of the plurality of regions in a second direction.

20. The integrated circuit of claim 18, wherein the network on chip system is configured to transmit configuration data to at least one of the plurality of regions.

* * * * *